(12) United States Patent
Won et al.

(10) Patent No.: US 7,951,620 B2
(45) Date of Patent: May 31, 2011

(54) WATER-BARRIER ENCAPSULATION METHOD

(75) Inventors: Tae K. Won, San Jose, CA (US); Jose Manuel Dieguez Campo, Hanau (DE); Sanjay D. Yadav, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 216 days.

(21) Appl. No.: 12/371,171

(22) Filed: Feb. 13, 2009

(65) Prior Publication Data

US 2009/0230425 A1   Sep. 17, 2009

Related U.S. Application Data

(60) Provisional application No. 61/036,230, filed on Mar. 13, 2008.

(51) Int. Cl.
   *H01L 21/00* (2006.01)
   *H01L 33/00* (2006.01)
(52) U.S. Cl. .......................... 438/26; 257/100
(58) Field of Classification Search .................. 257/100, 257/642, 788–795; 438/26, 82
   See application file for complete search history.

(56) References Cited

U.S. PATENT DOCUMENTS

| | | | |
|---|---|---|---|
| 5,757,126 A | 5/1998 | Harvey, III et al. | |
| 6,570,325 B2 | 5/2003 | Graff et al. | |
| 7,183,197 B2 | 2/2007 | Won et al. | |
| 7,214,600 B2 | 5/2007 | Won et al. | |
| 7,220,687 B2 | 5/2007 | Won | |
| 7,560,747 B2 * | 7/2009 | Cok | 257/98 |
| 2004/0238846 A1 | 12/2004 | Wittmann et al. | |
| 2007/0114521 A1 | 5/2007 | Hayashi et al. | |
| 2007/0222817 A1 | 9/2007 | Kurita et al. | |

OTHER PUBLICATIONS

Search report and written opinion for PCT/US09/034266 (APPM/012814PCT) dated Feb. 17, 2009.
Akedo, "Fabrication of OLEDs on Epoxy Substrates with SiNx/CNx:H Multi-Layer Barrier Films" IDW'04, pp. 1367-1370.
Akedo, "LP-5: Late-News Poster: Plasma-CVD SiNx / Plasma-Polymerized CNx: H Multi-Layer Passivation Films for Organic Light Emitting Diodes" SID 03 DIGEST, pp. 559-561.
Search report and written opinion for PCT/US09/034266 dated Feb. 17, 2009.

* cited by examiner

*Primary Examiner* — Calvin Lee
(74) *Attorney, Agent, or Firm* — Patterson & Sheridan, L.L.P.

(57) ABSTRACT

The present invention generally relates to organic light emitting diode (OLED) structures and methods for their manufacture. To increase the lifetime of an OLED structure, an encapsulating layer may be deposited over the OLED structure. The encapsulating layer may fully enclose or "encapsulate" the OLED structure. The encapsulating layer may have a substantially planar surface opposite to the interface between the OLED structure and the encapsulating layer. The planar surface permits successive layers to be evenly deposited over the OLED structure. The encapsulating layer reduces any oxygen penetration into the OLED structure and may increase the lifetime of the OLED structure.

20 Claims, 4 Drawing Sheets

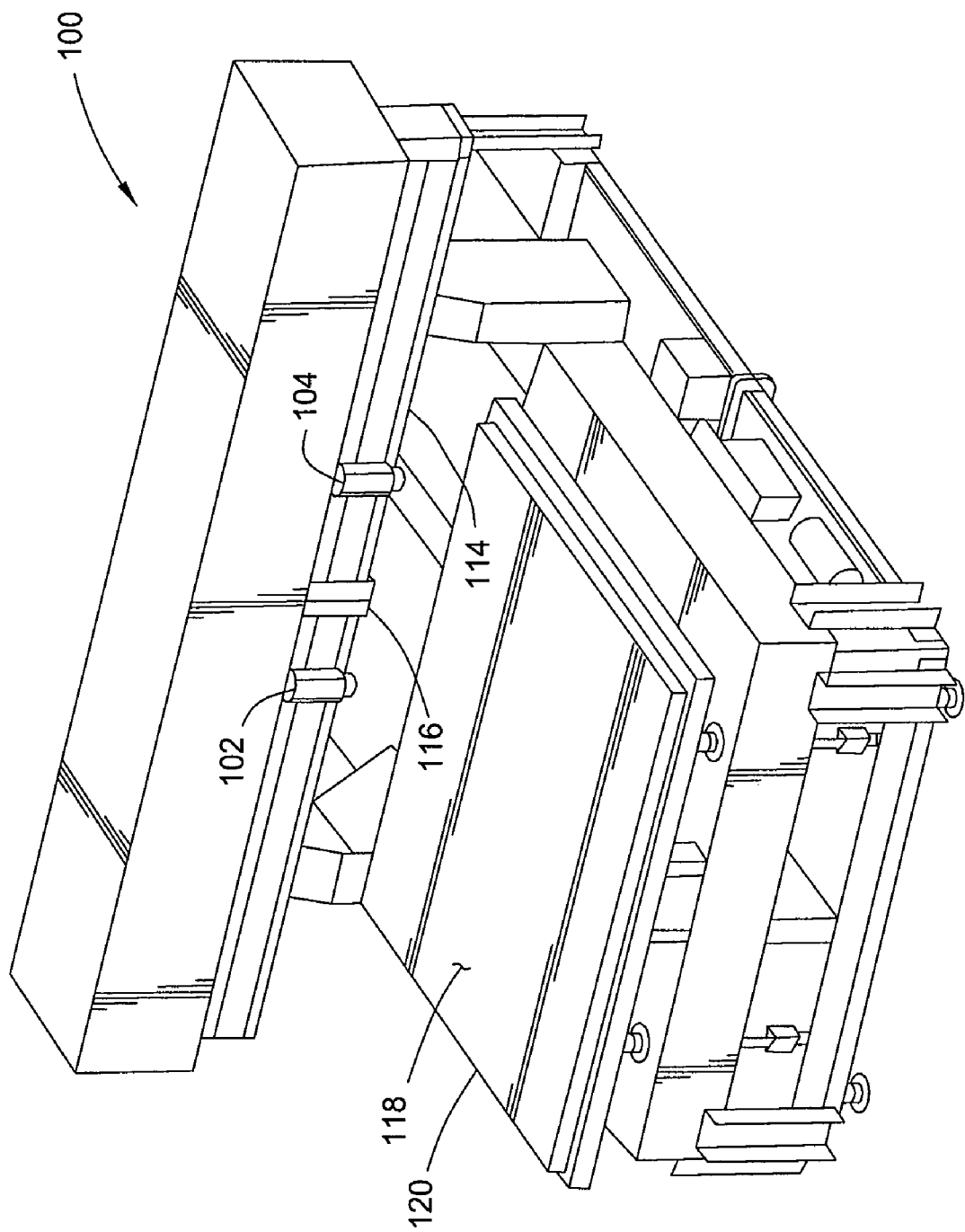
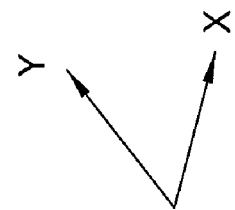

WATER-BARRIER ENCAPSULATION METHOD

CROSS-REFERENCE TO RELATED APPLICATIONS

This application claims benefit of U.S. Provisional Patent Application Ser. No. 61/036,230 (APPM/012814L), filed Mar. 13, 2008, which is herein incorporated by reference.

BACKGROUND OF THE INVENTION

1. Field of the Invention

Embodiments of the present invention generally relate to an organic light emitting diode (OLED) structure and a method for its manufacture.

2. Description of the Related Art

OLED displays have gained significant interest recently in display applications in view of their faster response times, larger viewing angles, higher contrast, lighter weight, lower power, and amenability to flexible substrates, as compared to liquid crystal displays (LCD). In addition to organic materials used in OLEDs, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), electrically pumped organic laser, and organic optical amplifier.

The lifetime of display devices can be limited, characterized by a decrease in electroluminescence efficiency and an increase in drive voltage. The limited lifetime may be due to the degradation of organic or polymer materials and the formation of non-emissive dark spots. Material degradation and dark spot problems may be caused by moisture and oxygen ingress. For example, exposure to humid atmospheres is found to induce the formation of crystalline structures of 8-hydroxyquinoline aluminum ($Alq_3$), which is often used as the emissive layer, resulting in cathode delamination, and hence, creating non-emissive dark spots growing larger in time. In addition, exposure to air or oxygen may cause cathode oxidation. Once organic material reacts with water or oxygen, the organic material is dead.

Therefore, there is a need in the art for an OLED structure that does not degrade or form non-emissive dark spots. There is also a need for a method to produce such a structure.

SUMMARY OF THE INVENTION

The present invention generally relates to OLED structures and methods for their manufacture. To increase the lifetime of an OLED structure, an encapsulating layer may be deposited over the OLED structure. The encapsulating layer may fully enclose or "encapsulate" the OLED structure. The encapsulating layer may have a substantially planar surface opposite to the interface between the OLED structure and the encapsulating layer. The planar surface permits successive layers to be evenly deposited over the OLED structure. The encapsulating layer reduces any oxygen penetration into the OLED structure and may increase the lifetime of the OLED structure.

In one embodiment, an organic light emitting diode structure comprises a substrate and an organic light emitting diode portion disposed over the substrate. The organic light emitting diode portion may comprise a hole transport layer, an emissive layer, and an encapsulating portion. The encapsulating portion may comprise an organic layer substantially enclosing the organic light emitting diode portion and coupled to both the organic light emitting diode portion and the substrate. The encapsulating portion may have a substantially planar surface extending over the entire organic layer and disposed opposite to an interface between the organic light emitting diode portion and the encapsulating portion.

In another embodiment, an organic light emitting diode manufacturing method comprises depositing an organic light emitting diode layered structure over a substrate and depositing an organic encapsulating layer over the organic light emitting diode layered structure and the substrate. The organic encapsulating layer may be coupled to both the substrate and the organic light emitting diode layered structure. The organic encapsulating layer may have a substantially planar surface extending across the entire surface opposite to an interface between the organic light emitting diode layered structure and the organic encapsulating layer.

In another embodiment, an organic light emitting diode manufacturing method comprises inkjet depositing an organic encapsulating layer over a substrate. The substrate having an organic light emitting diode layered structure disposed thereon. The encapsulating layer may be coupled to both the substrate and the organic light emitting diode layered structure. The encapsulating layer may have a substantially planar surface disposed opposite to an interface between the organic light emitting diode layered structure and the organic encapsulating layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic perspective view of an apparatus 100 for inkjet printing according to one embodiment of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2:
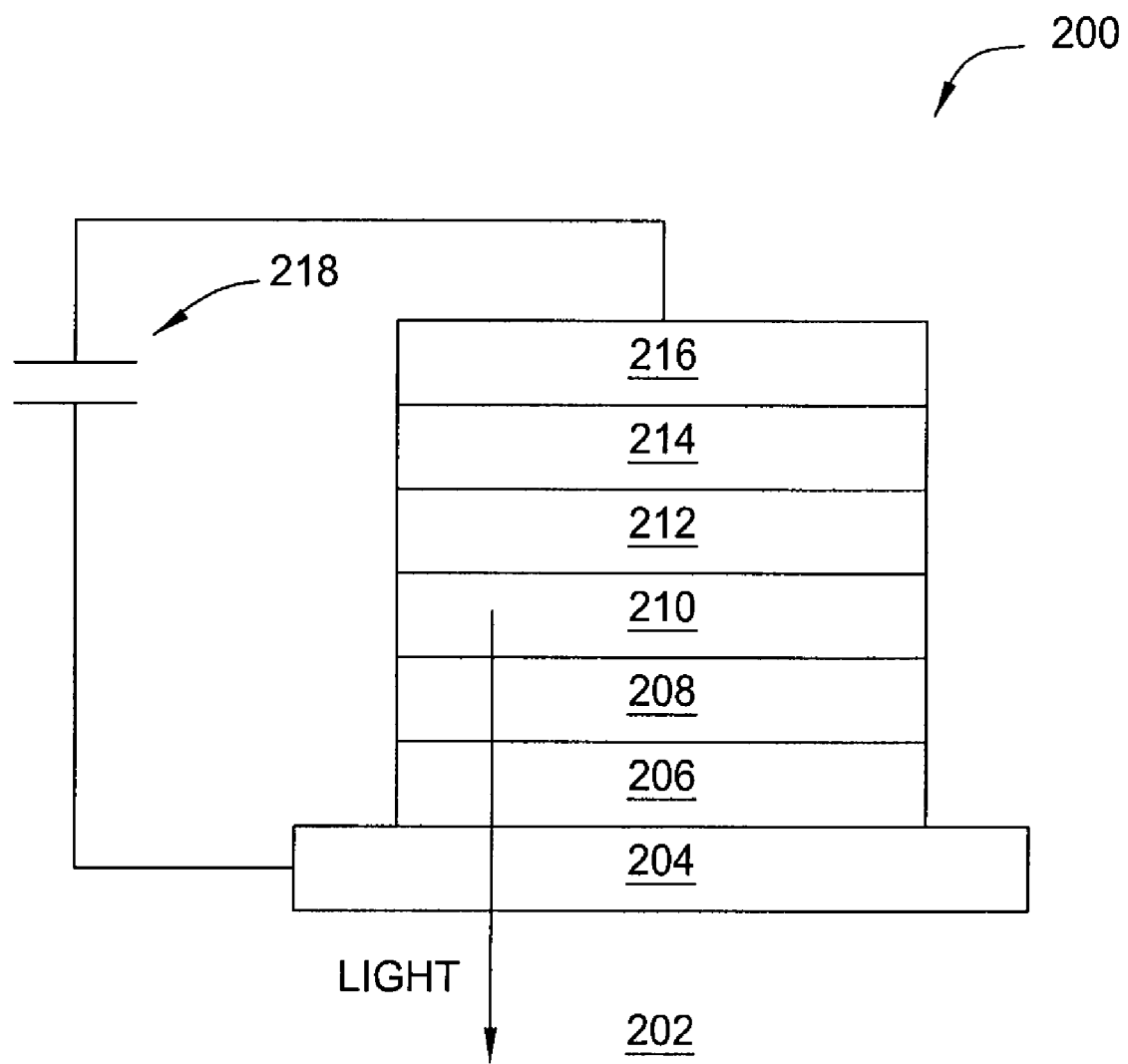
FIG. 2 is an OLED structure 200 according to one embodiment of the invention.

The present invention generally relates to OLED structures and methods for their manufacture. To increase the lifetime of an OLED structure, an encapsulating layer may be deposited over the OLED structure. The encapsulating layer may fully enclose or "encapsulate" the OLED structure. The encapsulating layer may have a substantially planar surface opposite to the interface between the OLED structure and the encapsulating layer. The planar surface permits successive layers to be evenly deposited over the OLED structure. The encapsulating layer reduces any oxygen penetration into the OLED structure and may increase the lifetime of the OLED structure.

FIG. 1 is a schematic perspective view of an apparatus 100 for inkjet printing according to one embodiment of the invention. It is to be understood that while two inkjet heads 102, 104, have been shown, more or less inkjet heads may be present. The apparatus 100 also includes a bridge 114 on which the inkjet heads 102, 104, are mounted. The inkjet heads 102, 104 may be spaced apart along the bridge 114 in an array fashion such that multiple inkjet heads 102, 104 may be used to deliver organic encapsulating material to the substrate 118. In one embodiment, the inkjet heads 102, 104 deliver organic encapsulating material to different areas of the substrate 118. In another embodiment, the inkjet heads 102, 104 may be coupled together. One or more monitors or cameras 116 may be mounted to the bridge 114. The substrate 118 may be disposed on a substrate stage 120. During operation, the substrate stage 120 may move the substrate 118 under the inkjet heads 102, 104, where inkjet droplets may be dispensed onto the substrate 118. The monitors or cameras 116 may perform metrology on the droplets as well as on the deposited material. The inkjet apparatus 100 may be used to deposit many of the films of an OLED structure.

FIG. 2 is an OLED structure 200 according to one embodiment of the invention. The structure 200 comprises a substrate 202. In one embodiment, the substrate 202 is a flexible, roll to roll substrate. It is to be understood that while the substrate 202 is described as a roll to roll substrate, other substrates may be utilized to produce OLEDs including soda lime glass substrates, silicon substrates, semiconductor wafers, polygonal substrates, large area substrates, and flat panel display substrates.

Over the substrate 202, an anode 204 may be deposited. In one embodiment, the anode 204 may comprise a metal such as chromium, copper, or aluminum. In another embodiment, the anode 204 may comprise a transparent material such as zinc oxide, indium-tin oxide, etc. The anode 204 may have a thickness between about 200 Angstroms and about 2000 Angstroms.

A hole injection layer 206 may then be deposited over the anode 204. The hole injection layer 206 may have a thickness between about 200 Angstroms and about 2000 Angstroms. In one embodiment, the hole injection layer 206 may comprise a material having a straight chain oligomer having a phenylenediamine structure. In another embodiment, the hole injection layer 206 may comprise a material having a branched chain oligomer having a phenylenediamine structure.

A hole transport layer 208 may be deposited over the hole injection layer 206. The hole transport layer 208 may have a thickness between about 200 Angstroms to about 1000 Angstroms. The hole transport layer 208 may comprise a diamine. In one embodiment, the hole transport layer 208 comprises a naphthyl-substituted benzidine (NPB) derivative. In another embodiment, the hole transport layer 108 comprises N,N'-diphenyl-N,N'-bis(3-methylphenyl)-(1,1'-biphenyl) .-4,4'-diamine (TPD).

An emissive layer 210 may be deposited over the hole transport layer 208. The emissive layer 210 may be deposited to a thickness between about 200 Angstroms to about 1500 Angstroms. Materials for the emissive layer 210 typically belong to a class of fluorescent metal chelated complexes. In one embodiment, the emissive layer comprises 8-hydroxyquinoline aluminum ($Alq_3$).

An electron transport layer 212 may be deposited over the emissive layer 210. The electron transport layer 212 may comprise metal chelated oxinoid compounds. In one embodiment, the electron transport layer 212 may comprise chelates of oxine itself (also commonly referred to as 8-quinolinol or 8-hydroxyquinoline). The electron transport layer 212 may have a thickness between about 200 Angstroms to about 1000 Angstroms.

An electron injection layer 214 may be deposited over the electron transport layer 212. The electron injection layer 214 may have a thickness between about 200 Angstroms to about 1000 Angstroms. The electron injection layer 214 may comprise a mixture of aluminum and at least one alkali halide or at least one alkaline earth halide. The alkali halides may be selected from the group consisting of lithium fluoride, sodium fluoride, potassium fluoride, rubidium fluoride, and cesium fluoride, and suitable alkaline earth halides are magnesium fluoride, calcium fluoride, strontium fluoride, and barium fluoride.

A cathode 216 may be deposited over the electron injection layer 214. The cathode 216 may comprise a metal, a mixture of metals, or an alloy of metals. In one embodiment, the cathode 216 may comprise an alloy of magnesium (Mg), silver (Ag), and aluminum (Al). The cathode 216 may have a thickness between about 1000 Angstroms and about 3000 Angstroms. An electrical bias may be supplied to the OLED structure 200 by a power source 218 such that light will be emitted and viewable through the substrate 202. The organic layers of the OLED structure 200 comprise the hole injection layer 206, the hole transport layer 208, the emissive layer 210, the electron transport layer 212, and the electron injection layer 214. It should be noted that not all five layers of organic layers are needed to build an OLED structure. For example, in some cases, only the hole transport layer 208 and the emissive layer 210 are needed.

Figure 3:
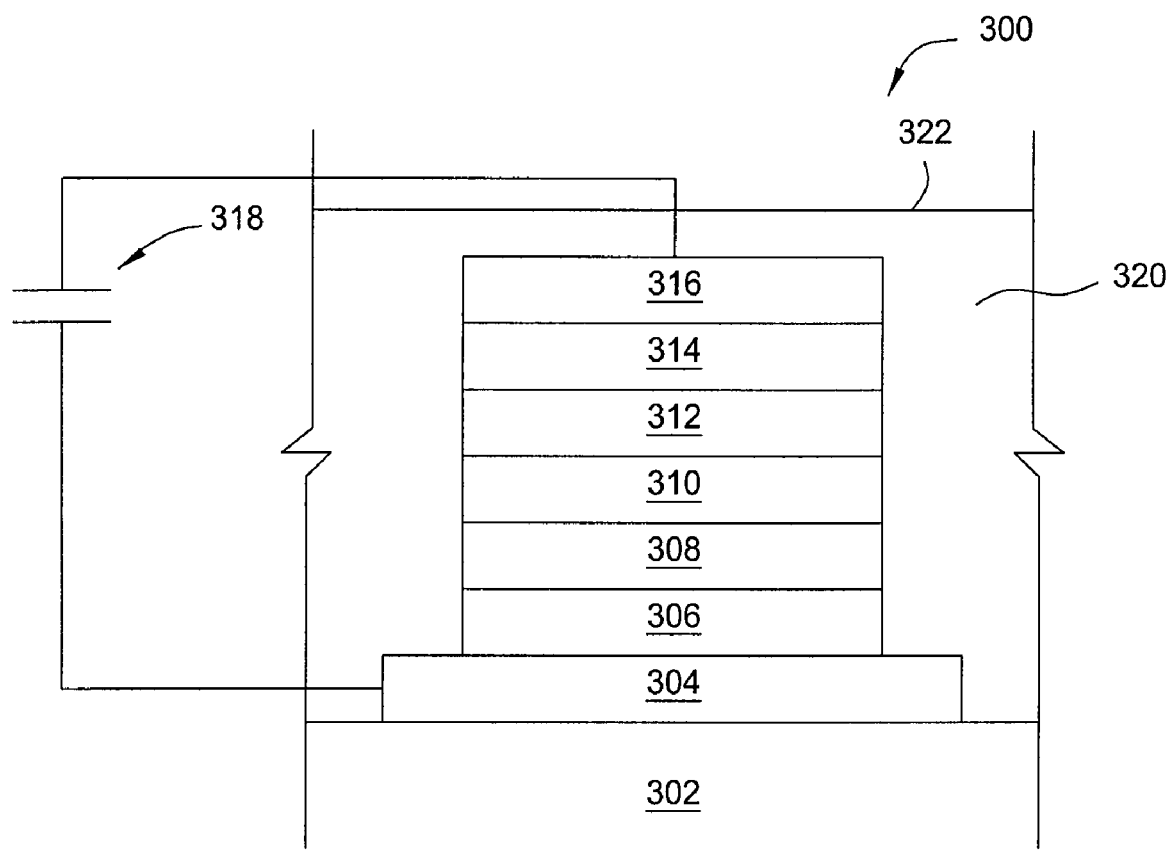
FIG. 3 is an OLED structure 300 incorporating an encapsulating layer 320 according to one embodiment of the invention.

FIG. 3 is an OLED structure 300 incorporating an encapsulating layer 320 according to one embodiment of the invention. The OLED structure 300 includes a substrate 302, anode 304, hole injection layer 306, hole transport layer 308, emissive layer 310, electron transport layer 312, electron injection layer 314, and a cathode 316. The OLED structure 300 may be connected to a power source 318. An encapsulating layer 320 may be deposited on the OLED structure 300. The encapsulating layer 320 may have a surface 322 that is substantially planar. The surface 322 may be disposed opposite to the interface between the encapsulating layer 320 and the cathode 316. It is to be understood that while five layers of organic layers are shown for the OLED structure 300, all five layers are not needed to build the OLED structure 300.

The encapsulating layer 320 may have a thickness between about 4 microns and about 6 microns. The encapsulating layer 320 may be deposited by inkjetting. In one embodiment, the encapsulating layer may comprise a mixture of an acrylate, a methacrylate, and acrylic acid. In one embodiment, the acrylate may comprise between about 25 volume percent to about 50 volume percent of the total mixture. In another embodiment, the acrylate may comprise between about 30 volume percent and about 40 volume percent of the total mixture.

The methacrylate may be present in an amount between about 10 volume percent and about 25 volume percent of the total mixture. In one embodiment, the methacrylate may be present in an amount between about 15 volume percent and about 20 volume percent of the total mixture. The acrylic acid may be present in an amount between about 2 volume percent and about 20 volume percent of the total mixture. In one embodiment, the acrylic acid may be present in an amount between about 2.5 volume percent and about 10 volume percent of the total mixture. Of course, it is to be understood that additional additives may be utilized to deposit the encapsulating layer 320.

The encapsulating layer 320 covers any defects that may be present on the OLED structure 300. The encapsulating layer 320 seals the defects. Additionally, the encapsulating layer 320 covers any particles that may be present on the OLED structure 300 and seals the particles under the encapsulating layer 320. Any voids that may be present on the OELD structure 300 may be covered and sealed by the encapsulating layer 320 also.

The encapsulating layer 320 may be deposited onto the OLED structure 320 and then planarized so that the uppermost surface 322 of the encapsulating layer 320 is substantially planar. The substantially planar surface 322 of the encapsulating layer 320 eliminates step coverage concern for any layers deposited after the encapsulating layer 320. Any layers deposited over the encapsulating layer 320 may thus be deposited to a uniform thickness over not just the OLED structure 200, but the entire device of which the OLED is a part.

Figure 4:
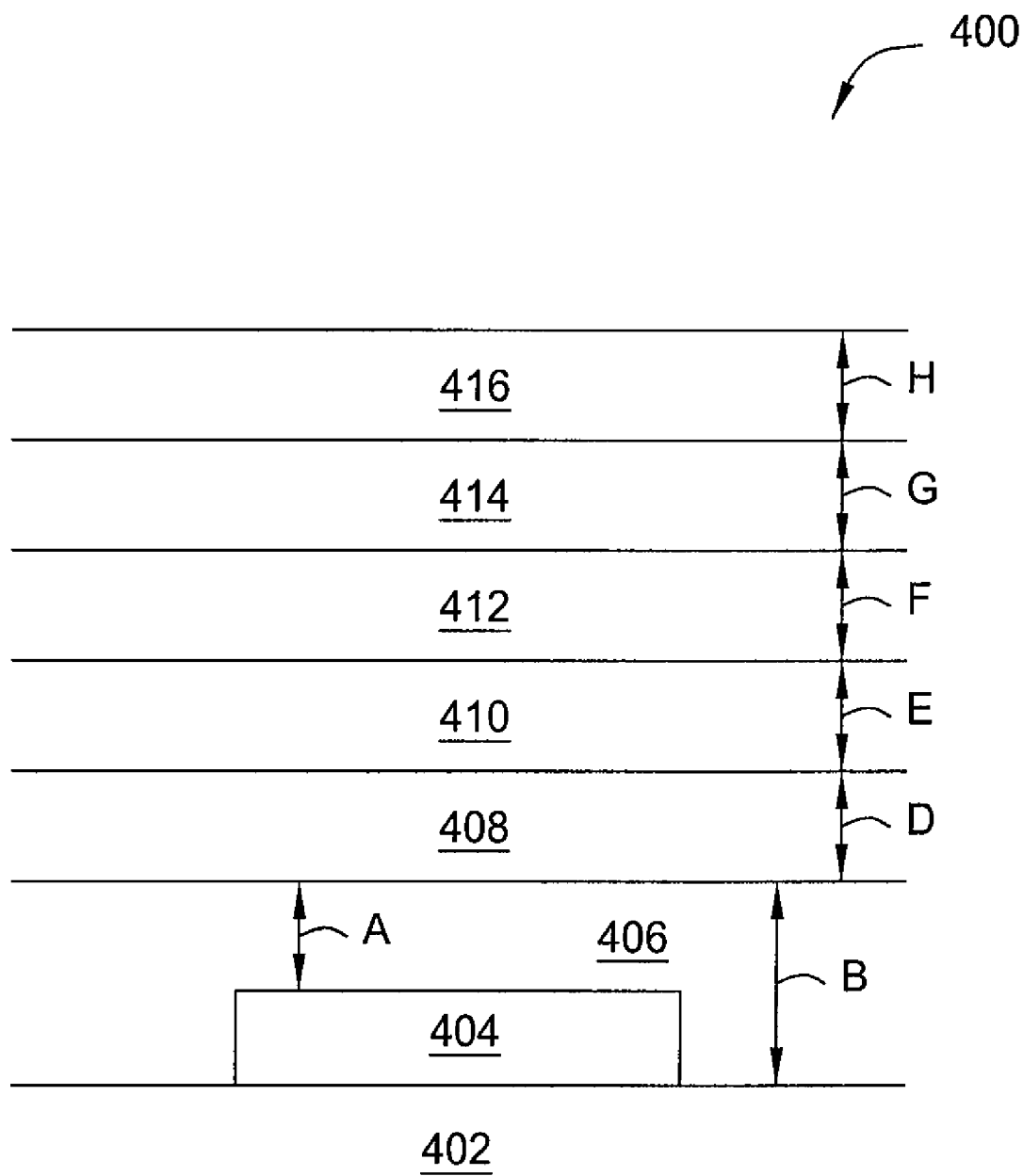
FIG. 4 is an OLED structure 400 incorporating an encapsulating layer 406 according to another embodiment of the invention.

FIG. 4 is an OLED structure 400 incorporating an encapsulating layer 406 according to another embodiment of the invention. The OLED structure 400 comprises a substrate 402 having an OLED portion 404 deposited thereon. An organic encapsulating layer 406 may be deposited over the OLED portion 404 and the substrate 402. After deposition, the encapsulating layer 406 may be planarized such that the surface opposite to the interface with the OLED portion 404 may be substantially planar. The encapsulating layer 406 will thus have a thin portion as shown by arrow "A" over the OLED portion 404 and a thicker portion, relative to the thin portion, as shown by arrow "B" over just the substrate 402.

Above the encapsulating layer 406, a multi-layer water-barrier encapsulation structure may be deposited to a thickness as shown by arrow "C". The first layer 408 deposited on the encapsulating layer 406 may comprise silicon and be deposited to a thickness shown by arrow "D". In one embodiment, the first layer 408 may comprise silicon nitride. In one embodiment, the first layer 408 may be between about 0.1 microns to about 0.6 microns thick.

The second layer 410 may be deposited over the first layer 408. The second layer 410 may comprise carbon. In one embodiment, the second layer 410 may have a thickness as shown by arrow "E" of between about 0.1 microns and about 0.6 microns. A third layer 412 may be deposited over the second layer 410. The third layer 412 may be deposited to a thickness as shown by arrow "F". In one embodiment, the thickness of the third layer 412 may be between about 0.1 microns and about 0.6 microns. The third layer 412 may comprise silicon. In one embodiment, the third layer 412 may comprise silicon nitride.

A fourth layer 414 may be deposited over the third layer 412. The fourth layer 414 may comprise carbon. In one embodiment, the fourth layer 414 may have a thickness as shown by arrow "G" of between about 0.1 microns and about 0.6 microns. A fifth layer 416 may be deposited over the fourth layer 414. The fifth layer 416 may be deposited to a thickness as shown by arrow "H". In one embodiment, the thickness of the fifth layer 416 may be between about 0.1 microns and about 0.6 microns. The fifth layer 416 may comprise silicon. In one embodiment, the fifth layer 416 may comprise silicon nitride.

Each layer of the multi-layer water-barrier encapsulation structure may have substantially the same thickness. The presence of the encapsulating layer 406 provides an additional water-barrier and permits the multi-layer water-barrier encapsulation structure to be thinner as compared to the situation where the encapsulating layer 406 is not present. In the absence of the encapsulating layer 406, the first layer 408, the second layer 410, the third layer 412, the fourth layer 414, and the fifth layer 416 may each have a thickness between about 3 microns and about 6 microns. The multi-layer water-barrier encapsulation structure may be thinner because it does not have to cover defects, particles or voids in the OLED portion 404.

Thus, by depositing an organic encapsulating layer over an OLED structure, defects, particles, and voids of the OLED structure may be covered and sealed. The encapsulating layer may be planarized after deposition. The planar surface allows subsequently deposited layers to have a uniform thickness over the entire device and not just the OLED structure due to the lack of step coverage for the subsequent layers. The encapsulating layer, by covering and sealing the OLED structure and the particles, voids, and defects, may reduce dark spot formation and OLED structure degradation.

While the foregoing is directed to embodiments of the present invention, other and further embodiments of the invention may be devised without departing from the basic scope thereof, and the scope thereof is determined by the claims that follow.

The invention claimed is:

1. An organic light emitting diode manufacturing method, comprising:
depositing an organic light emitting diode layered structure over a substrate;
depositing an organic encapsulating layer over the organic light emitting diode layered structure and the substrate such that the organic encapsulating layer is coupled to both the substrate and the organic light emitting diode layered structure; wherein the organic encapsulating layer has a substantially planar surface extending across the entire surface opposite to an interface between the organic light emitting diode layered structure and the organic encapsulating layer; and
depositing a multi-layer water-barrier encapsulation structure on the organic encapsulating layer, wherein the water-barrier encapsulation structure comprises at least one layer having carbon.

2. The method of claim 1, wherein the organic encapsulating layer is deposited by inkjetting or spin coating.

3. The method of claim 1, wherein the organic encapsulating layer comprises a mixture of an acrylate, a methacrylate, and acrylic acid.

4. The method of claim 3, wherein the acrylate comprises about 25 volume percent to about 50 volume percent.

5. The method of claim 3, wherein the methacrylate comprises about 10 volume percent to about 25 volume percent.

6. The method of claim 1, further comprising:
depositing one or more layers comprising silicon on the organic encapsulating layer; and
depositing one or more layers comprising carbon over the one or more layers comprising silicon.

7. An organic light emitting diode manufacturing method, comprising:
inkjet depositing an organic encapsulating layer over a substrate, the substrate having an organic light emitting diode layered structure disposed thereon, and over the organic light emitting diode layered structure such that the organic encapsulating layer is coupled to both the substrate and the organic light emitting diode layered structure and has a substantially planar surface disposed opposite to an interface between the organic light emitting diode layered structure and the organic encapsulating layer; and depositing a multi-layer water-barrier encapsulation structure on the organic encapsulating layer, wherein the water-barrier encapsulation structure comprises at least one layer having carbon.

8. The method of claim 7, wherein the inkjet depositing further comprises ink jetting a mixture of an acrylate, a methacrylate, and acrylic acid onto the substrate and the organic light emitting diode layered structure.

9. The method of claim 8, wherein the acrylate comprises about 25 volume percent to about 50 volume percent.

10. The method of claim 8, wherein the methacrylate comprises about 10 volume percent to about 25 volume percent.

11. The method of claim 8, wherein the acrylic acid comprises about 2.5 volume percent to about 10 volume percent.

12. The method of claim 7, further comprising measuring the thickness of the organic encapsulating layer during the inkjet depositing.

13. The method of claim 7, further comprising controlling the inkjet depositing such that a greater amount of organic encapsulating material is deposited on the substrate as compared to an amount of organic encapsulating material deposited on the organic light emitting diode layered structure.

14. An organic light emitting diode structure, comprising:
a substrate;
an organic light emitting diode portion disposed over the substrate, the organic light emitting diode portion comprising a hole transport layer and an emissive layer;
an encapsulating portion disposed on the organic light emitting diode portion; wherein the encapsulating portion comprises an organic layer substantially enclosing the organic light emitting diode portion and coupled to both the organic light emitting diode portion and the substrate, and has a substantially planar surface extending over the entire organic layer and disposed opposite to an interface between the organic light emitting diode portion and the encapsulating portion; and
a multi-layer water-barrier encapsulation structure deposited on the encapsulating portion, wherein the water-barrier encapsulation structure comprises at least one layer having carbon.

15. The structure of claim 14, wherein the organic light emitting diode portion comprises:
a transparent anode layer;
a hole-injection layer disposed over the transparent anode layer;
the hole transport layer disposed over the hole-injection layer;
the emissive layer disposed over the hole transport layer;
an electron injection layer disposed over the emissive layer; and
a cathode layer disposed over the electron injection layer.

16. The structure of claim 14, wherein the encapsulating portion further comprises one or more layers comprising silicon and one or more layers comprising carbon disposed over the organic layer.

17. The structure of claim 16, wherein the one or more layers comprising silicon comprise silicon nitride.

18. The structure of claim 17, wherein the one or more layers comprising silicon and the one or more layers comprising carbon are disposed over the organic layer in alternating fashion.

19. The structure of claim 17, wherein the one or more layers comprising silicon and the one or more layers comprising carbon each individually have a thickness between about 0.1 microns to about 0.6 microns.

20. The structure of claim 17, wherein the one or more layers comprising silicon and the one or more layers comprising carbon collectively have a thickness between about 3 microns and about 6 microns.

* * * * *